United States Patent [19]
Przybysz et al.

[11] Patent Number: 4,516,315
[45] Date of Patent: May 14, 1985

[54] METHOD OF MAKING A SELF-PROTECTED THYRISTOR

[75] Inventors: John X. Przybysz, Pittsburgh, Pa.; Earl S. Schlegel, deceased, late of Columbia, Md., by Barbara W. Schlegel, Administratrix

[73] Assignee: Westinghouse Electric Corp., Pittsburgh, Pa.

[21] Appl. No.: 492,772

[22] Filed: May 9, 1983

[51] Int. Cl.³ .................. H01L 21/223; H01L 21/265; H01L 21/302; H01L 29/74
[52] U.S. Cl. ..................................... 29/576 B; 29/580; 29/582; 29/583; 148/1.5; 148/187; 357/20; 357/38
[58] Field of Search ..................... 29/576 B, 580, 581, 29/582, 583; 219/121 LG, 121 LH, 121 LJ; 357/38, 20, 13; 148/1.5, 187

[56] References Cited

U.S. PATENT DOCUMENTS 4,047,219 9/1977 Temple .................................. 357/38

OTHER PUBLICATIONS

Przybysz, J. X. et al., "Thyristors with Overvoltage Self-Protection" in 1981 *International Electron Device Meeting Technical Digest*, pp. 410–413.

Primary Examiner—Brian E. Hearn
Assistant Examiner—Alan E. Schiavelli
Attorney, Agent, or Firm—C. L. Menzemer

[57] ABSTRACT

The present invention is directed to a thyristor self-protected against overvoltage by the avalanche mechanism, the protection resulting from a well cut in the top surface of the thyristor and extending through one base region of the thyristor and forming two regions of opposite conductivity type at the bottom of said well, and to the process for making the thyristor.

4 Claims, 4 Drawing Figures

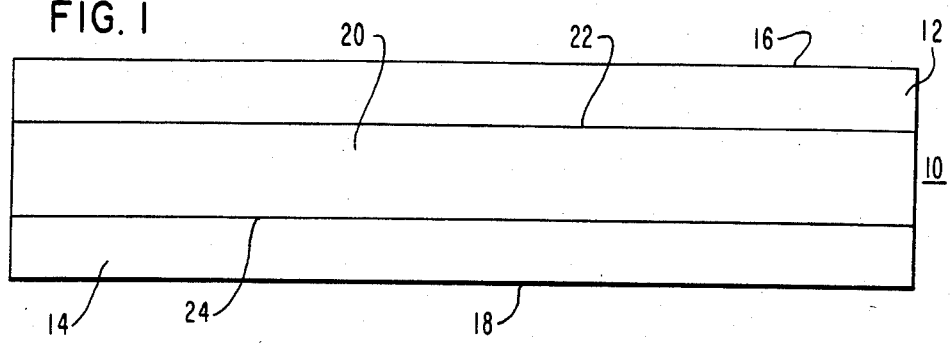
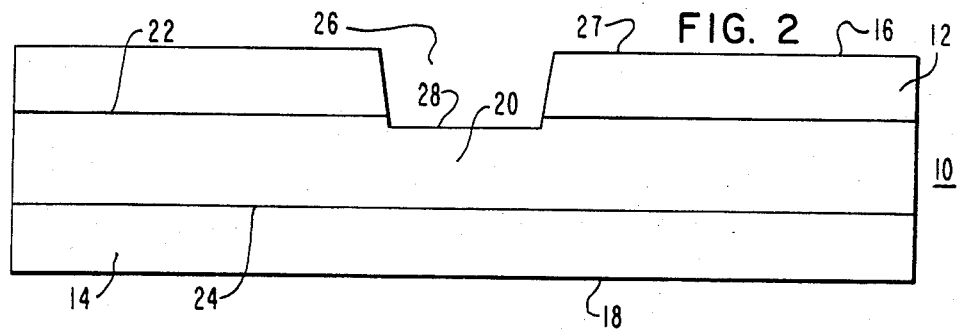
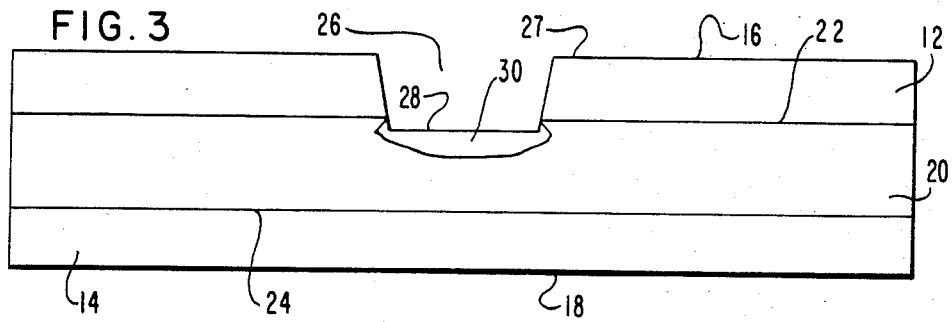
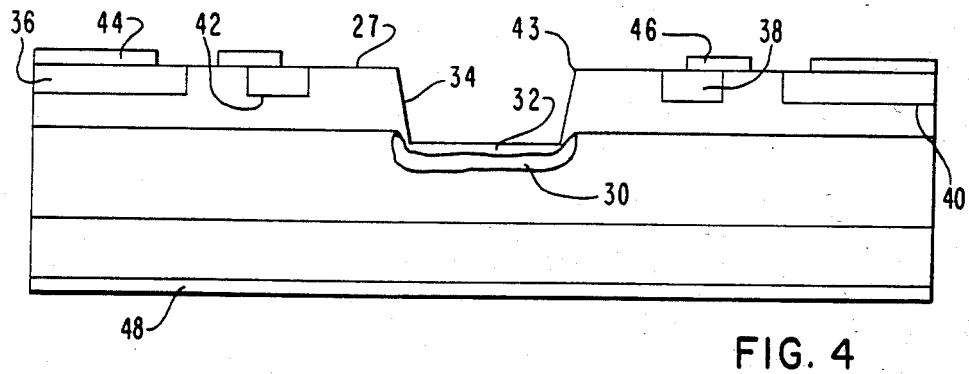

METHOD OF MAKING A SELF-PROTECTED THYRISTOR

CROSS REFERENCE TO RELATED APPLICATION

The present application is related to patent application Ser. No. 434,192, filed Oct. 13, 1982, and patent application Ser. No. 468,016, filed Feb. 18, 1983, the assignee of both of which is the same as that of the present invention.

BACKGROUND OF THE INVENTION

1. Field of the Invention

The present invention is in the field of power semiconductors generally and is specifically directed to overvoltage self-protected thyristors.

2. Description of the Prior Art:

Typically overvoltage protection of a thyristor employs an avalanche current in the gate region to trigger the thyristor. The avalanching is achieved by etching a well, in the gate region, during processing of a silicon wafer, the etching usually occurring after an aluminum diffusion and before a gallium diffusion is carried out. The avalanche voltage is determined by the depth and profile of the etched well.

The use of avalanching for self-protection will succeed or fail depending upon whether the avalanche voltage is less than or more than the edge breakdown voltage of the device.

The use of avalanching necessarily involves some derating of the electrical parameters of the device. Particularly, there is a derating of the forward blocking voltage, $V_{DRM}$, along with an attendant increase in forward drop, $V_F$, for the same $V_{DRM}$.

The deep well prior art is discussed in "Thyristors With Overvoltage Self-Protection", J. X. Przybysz and E. S. Schlegel, 1981 IEDM, pgs. 410–413 and in patent application Ser. No. 434,192, filed Oct. 13, 1982 and Ser. No. 468,016, filed Feb. 18, 1983.

Two other prior art methods of overvoltage protection are (1) a thinned anode base for controlling $V_{BO}$ location and voltage level, and (2) using a curved forward blocking junction.

The thin anode base and curved junction technique for achieving overvoltage protection are discussed in "Controlled Thyristor Turn-On For High DI/DT Capability", V. A. K. Temple, 1981 IEDM, pgs. 406–409.

The use of auxiliary thyristors and inhomogeneous or heterogeneous doping of the n-type base region is discussed in "A Thyristor Protected Against di/dt Failure At Breakdown Turn-On", P. Voss, Solid State Electronics, 1974, Vol. 17, pgs. 655–661.

U.S. Pat. No. 4,003,072 teaches curved junctions as a means of overvoltage protection.

"A New Bipolar Transistor-GAT", Hisao Kondo and Yoshinori Yukimoto, IEEE Transactions On Electronic Devices, Vol. Ed. 27 No. 2, Feb. 1980, pgs. 373–379 is a typical example of prior art teachings of a transistor in which the base region has portions extending deeper into the collector region than the remainder of the base region to contact the depletion region.

Application Ser. No. 190,699 filed Sept. 25, 1980 is an example of several applications filed in which the p-type base region of a thyristor has spaced-apart portions extending into the n-type base region to contact the depletion region.

Application Ser. No. 357,106, filed Mar. 3, 1982 teaches providing overvoltage protection in a thyristor by pulsing the center of a gating region of a thyristor with a laser thereby deforming the blocking junction and resulting in a portion of the p-type base extending into the n-type base region.

SUMMARY OF THE INVENTION

A process for making a thyristor, said thyristor being self-protected from overvoltage by the avalanche mechanism, comprising, forming two regions of a second-type conductivity in a body of semiconductor material of a first-type conductivity by diffusing a suitable doping material through, said top and bottom surfaces of said body, said two regions of second type conductivity being separated by a region of said first type conductivity forming a well in a central portion of said top surface of said body, said well extending at least entirely through said region of second-type conductivity formed by diffusion through said top surface of said body of first-type of conductivity, said well having a bottom surface, implanting ions, capable of forming a region of first type conductivity, through said bottom surfaces of said well, whereby a region of said first type of conductivity is formed adjacent to the bottom surface of said well, forming a region of said second type of conductivity at least between said bottom surface of said well and said region of first type conductivity formed by ion implantation, activating said implanted region, forming at least one region of said first type of conductivity in said region of second type conductivity formed by diffusion through said top surface, said at least one region being spaced apart from said well, said at least one region extending into said region of second type of conductivity to a width less than the width of the region of second type conductivity, affixing metal electrical contacts to said top surface of said body in ohmic electrical contact with said at least one region and said region of second-type of conductivity, affixing a second metal electrical contact to the bottom surface of said body in ohmic electrical contact with said region of second type conductivity formed by diffusion through said bottom surface of said body.

The present invention also includes a thyristor self protected from overvoltage by avalanche, comprising a top surface and a bottom surface, a first base region, said first base region extending from the top surface into said thyristor, at least a first emitter region disposed within said first base region and extending to the top surface of said thyristor, said at least first emitter region being spaced apart from a central portion of said top surface, a first metal electrode in ohmic electrical contact with said at least first emitter region, a first pn junction between said first emitter region and said first base region, a second base region adjacent to said first base region, a second pn junction between said first base region and said second base region, another emitter region adjacent to said second base region and extending from said second base region to said bottom surface, a third pn junction between said second base region and said another emitter region, said second pn junction being a forward blocking junction and said third pn junction being a reverse blocking junction, a well disposed within said a first base region said well having a bottom surface, said well being spaced apart from said at least first emitter region, said well extending from the central portion of the top surface of said thyristor through the first base region, a region having the same type of conductivity as said first base region adjacent the bottom surface of said well, another region having the same conductivity type as said second base region disposed immediately below the region adjacent the bottom surface of said well, said latter two regions having a lateral area approximately equal to the lateral area of the bottom surface of said well, and a metal electrode affixed to the bottom surface of the thyristor in ohmic electrical contact with said another emitter region.

BRIEF DESCRIPTION OF THE DRAWINGS

For a better understanding of the present invention reference should be had to the following detailed discussion and drawings, in which:

FIG. 1 is a side view of a body of semiconductor material being processed in accordance with the teachings of this invention;

FIGS. 2 and 3 are side views of the body of FIG. 1 undergoing further processing in accordance with the teachings of this invention; and FIG. 4 is a side view of a thyristor prepared in accordance with the teachings of this invention.

DESCRIPTION OF PREFERRED EMBODIMENTS

With reference to FIG. 1, there is shown a body of semiconductor material 10. The body 10 is preferably if silicon but the present invention is equally applicable to any semiconductor material.

Assuming for purposes of description that the body 10 was originally of 220 ohm-cm n type silicon.

There is a first p-type region 12 and a second p-type region 14 formed within the body 10 by diffusion through top surface 16 and bottom surface 18 respectively. An n-type region 20 consisting of the orginal 220 ohm-cm n-type silicon is disposed between regions 12 and 14.

Typically, in a 2800 volt thyristor p-type regions 12 and 14 will have a thickness of approximately 125 microns and be doped to a surface concentration of $8 \times 10^{17}$ atoms/cc. The dopant may be one or more of the known p-type dopants as, for example, aluminum, gallium and boron. An aluminum and gallium two stage diffusion is commonly used in making thyristors of this type.

The n-type region 20 will typically have a width of approximately 525 microns.

There is a pn junction 22 between regions 12 and 20 and a pn junction 24 between regions 14 and 20.

With reference to FIG. 2, following the formation of p-type regions 12 and 14 by diffusion, a well 26 is formed in central portion 27 of top surface 16. A photo resist mask can be used in forming the well.

The well may be formed by chemical etching, laser etching, sand or other abrasive particle blasting, drilling or by any other method known to those skilled in the art. Preferably, the well 26 is formed by laser etching.

Any laser known to those skilled in the art that will etch silicon may be used. Examples of suitable lasers include ruby and YAG lasers. Particularly satisfactory is a Q switch YAG laser 25 watts, 10 KH with approximately 2.5 millijoules per pulse.

The width or diameter of the well 26 along bottom surface 28 of the well depends on how large an area is necessary to dissipate the "turn-on" switching energy of the finished thyristor. A width or diameter of from 20 to 65 mils has been found satisfactory. A width or diameter of 65 mils being adequate for a thyristor with a blocking voltage of from 3,000 to 4,000 volts.

The depth of the well 26 should be at least equal to the width of the p-type region 12. In the instant case where p-type region 12 has a width of 120 microns, the well 26 would preferably have a depth of about 125 microns.

With reference to FIG. 3, following the formation of the well 26, an n-type region 30 is formed adjacent to bottom surface 28 of the well 26 in n-type region 20.

The n-type region 30 is formed by ion implantation. For the finished thyristor to function as intended, the regions should have a width of less than a micron, preferably about 0.65 microns.

The ion implant can be performed using any n-type dopant that can be ion implanted as, for example, phosphorus and arsenic. Phosphorus is preferred.

The ion implant can be carried out with an energy of 400,000 volts and a dosage of the order of $10^{11}$ to $10^{12}$ atoms/sq.cm.

The lateral area, of the region 30 should be approximately equal to but not less than the diameter of the bottom surface 28 of the well 26.

The region 30 should have a peak doping concentration of $3 \times 10^{16}$ atoms/cc.

The photoresist mask that was used in forming the well can also be used in forming the ion implant region 30.

With reference to FIG. 4, following the formation of region 30, a second ion implant using a suitable p-type dopant is carried out to form region 32 between the ion implanted region 30 and the bottom surface 28 of the well 26.

This second ion implant can be performed using any p-type dopant that can be ion implanted as, for example, gallium, aluminum and boron. Boron is preferred.

The ion implant can be carried out with an energy of 40,000 volts and a dosage of the order of 1 to $5 \times 10^{12}$ atoms/sq.cm.

The region 32 will have a thickness of 0.2 microns and a peak doping level of $2.5 \times 10^{17}$ atoms/cc.

The lateral area of the region 32 is approximately equal to that of region 30.

The region 32 merges into p-type region 12 and isolates region 30 from bottom surface 28 or side walls 34 of the well 26.

The first implant region, n-type region 30, must be formed by ion implant to ensure a thin uniformly doped region.

The second implant region, p-type region 32, could be formed by diffusion. However, the formation of region 32 preferably is formed by ion implantation since ion implantation provides more control over thickness or width and uniformity of doping.

Following the ion implantation, the ion implanted region or preferably regions, are activated by heating the body 10 at a temperature of from 950° C. to 1050° C., preferably 950° C. for from 15 to 30 minutes, preferably 30 minutes in an inert atmosphere. The time and temperature of this activation heating are not long enough or at a high enough temperature to effect the previous regions formed by diffusion.

Following, the activation of the ion implant region or regions, n-type regions 36 and 38 are formed in p-type region 12 by diffusion.

N-type region 36 serves as a cathode emitter region and n-type region 38 serves as an auxiliary emitter region.

The two n-type regions 36 and 38 would be doped to a surface concentration of from $10^{20}$ to $10^{21}$ atoms/cc with the doping concentration of pn junctions 40 and 42 being from $3 \times 10^{16}$ atoms/cc. The n-type regions 36 and 38 would have a typical width or thicknes of 35 microns.

There is a pn junction 40 between emitter region 36 and base region 12 and a pn junction 42 between auxiliary emitter region 38 and base region 12.

PN junction 22 is the forward blocking junction of the thyristor and pn junction 24 is the reverse blocking junction of the thyristor.

It will be noted from FIG. 4 that the emitter region 36 and the auxiliary emitter region 38 are spaced apart from the central portion 27 of surface 16 and the well 26. This is to ensure "turn-on" in the center of the thyristor. The distance between outer edge 43 of well 26 and the auxiliary emitter region 38 or any other adjacent region, should be at least two diffusion lengths which is approximately 70 microns in n-type silicon.

A first metal electrode 44 is affixed to top surface 16 in ohmic electrical contact with cathode emitter region 36.

A second metal electrode 46 is affixed to top surface 16 in ohmic electrical contact with auxiliary emitter 38 and base region 12. The electrode 46 bridges the pn junction 42 and electrically shorts region 38 to region 12.

Typically electrodes 44 and 46 are of aluminum.

A third electrode 48 is affixed to bottom surface 18 and is in ohmic electrical contact with anode emitter region 14. Typically electrode 48 is of molybdenum.

In operation of the thyristor of FIG. 4, the junction avalanche voltage will be lower around the periphery of the implanted region 30 and the thyristor is made to breakdown at the edge of the well. The avalance current is used to trigger the thyristor whenever an overvoltage occurs.

While the present invention has been described in terms of a particular thyristor, it will be understood that the teachings are applicable to thyristors in general.

We claim as our invention:

1. A process for making a thyristor, said thyristor being self-protected from overvoltage by the avalanche mechanism, comprising, forming two regions of a second type of conductivity in a body of semiconductor material of a first type of conductivity by diffusing a suitable doping material through a top and a bottom surface of said body, said two regions of second type conductivity being separated by a region of said first type conductivity, forming a well in a central portion of said top surface of said body, said well extending at least entirely through said region of second type conductivity formed by diffusion through said top surface of said body of first type conductivity, said well having a bottom surface, implanting ions, capable of forming a region of first type of conductivity, through said bottom surface of said well, whereby a region of said first type of conductivity is formed adjacent to the bottom surface of said well, forming a region of said second type of conductivity between said bottom surface of said well and said region of first type conductivity formed by ion implantation, activating said implanted region, forming at least one region of said first type of conductivity in said region of second type conductivity formed by diffusion through said top surface, said at least one region being spaced apart from said well, said at least one region extending into said region of second type of conductivity to a width less than the width of the region of second type conductivity, affixing metal electrical contacts to said top surface of said body in ohmic electrical contact with said at least one region and said region of second type of conductivity, affixing a second metal electrical contact to the bottom surface of said body in ohmic electrical contact with said region of second type conductivity formed by diffusion through said bottom surface of said body.

2. The process of claim 1 in which the well enters into the region of first type of conductivity that separates the two regions of second type conductivity formed by diffusion through the top and bottom surfaces of the body.

3. The process of claim 1 in which the region of second type conductivity disposed between the bottom surface of said well and the region of first type conductivity formed by ion implantation, is formed by ion implantation.

4. The process of claim 3 in which the well is formed by laser etching.

* * * * *